United States Patent
Oh

(10) Patent No.: US 9,647,101 B2
(45) Date of Patent: May 9, 2017

(54) SILICENE MATERIAL LAYER AND ELECTRONIC DEVICE HAVING THE SAME

(71) Applicant: SAMSUNG ELECTRONICS CO., LTD., Suwon-si (KR)

(72) Inventor: Youngtek Oh, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 27 days.

(21) Appl. No.: 14/878,098

(22) Filed: Oct. 8, 2015

(65) Prior Publication Data

US 2016/0104790 A1    Apr. 14, 2016

(30) Foreign Application Priority Data

Oct. 8, 2014 (KR) .................. 10-2014-0135967

(51) Int. Cl.
*H01L 29/778* (2006.01)
*H01L 29/167* (2006.01)
*H01L 29/267* (2006.01)
*H01L 29/423* (2006.01)

(52) U.S. Cl.
CPC .......... *H01L 29/778* (2013.01); *H01L 29/167* (2013.01); *H01L 29/267* (2013.01); *H01L 29/4232* (2013.01)

(58) Field of Classification Search
CPC ................. H01L 29/778; H01L 29/167; H01L 29/66015; H01L 29/66037; H01L 29/66045; H01L 2924/13088; H01L 2924/13061
See application file for complete search history.

(56) References Cited

U.S. PATENT DOCUMENTS

| | | | |
|---|---|---|---|
| 1,745,175 A | 1/1930 | Lilienfeld | |
| 1,877,140 A | 9/1932 | Lilienfeld | |
| 1,900,018 A | 3/1933 | Lilienfeld | |
| 3,206,670 A | 9/1965 | Atalla | |
| 9,472,675 B2* | 10/2016 | Cho | .................. H01L 29/78684 |
| 2010/0055464 A1* | 3/2010 | Sung | ........................ B01J 21/18 |
| | | | 428/408 |
| 2010/0148225 A1 | 6/2010 | Mouli | |
| 2012/0068154 A1* | 3/2012 | Hwang | ................. H01L 51/502 |
| | | | 257/13 |

OTHER PUBLICATIONS

J. Sivek et al, "Adsorption and absorption of Boron, Nitrogen, Aluminium and Phosphorus on Silicene: stability, electronic and phonon properties", Departement Fysica, Universiteit Antwerpen, Groenenborgerlaan 171, B-2020 Antwerpen, Belgium, Feb. 18, 2013, Total 9 pages.

(Continued)

*Primary Examiner* — Jose R Diaz
(74) *Attorney, Agent, or Firm* — Sughrue Mion, PLLC

(57) ABSTRACT

Provided are silicene material layers and electronic devices having a silicene material layer. The silicene material layer contains silicon atoms in a 2-dimensional honeycomb structure formed as one of a monolayer and a double layer. The silicene material layer includes a doping region doped with at least one material from the group of Group 1, Group 2, Group 16 and Group 17 and at least one of a p-type dopant or an n-type dopant.

20 Claims, 5 Drawing Sheets

(56) References Cited

OTHER PUBLICATIONS

Boubekeur Lalmi et al., "Epitaxial growth of a silicene sheet", American Institute of Physics, Applied Physics Letters 97, 223109, (2010), Total 3 pages, http://dx.doi.org/10.1063/1.3524215.
Gian G. Guzmán-Verri and L. C. Lew Yan Voon, "Electronic structure of silicon-based nanostructures", Physical Review B 76, 075131, (2007), Published Aug. 30, 2007, Total 10 pages.
Ruge Quhe, et al., "Tunable and sizable band gap in silicene by surface adsorption", Scientific Reports, 2 : 853, Nov. 14, 2012, pp. 1-6.
Zeyuan Ni, et al., "Tunable Band Gap and Doping Type in Silicene by Surface Adsorption: towards Tunneling Transistors", Dec. 16, 2013, pp. 1-30.
Zeyuan Ni, et al., "Tunable Bandgap in Silicene and Germanene", NANO Letters, Dec. 2012, Nov. 3, 2011, p. 113, ACS Publications.

* cited by examiner

SILICENE MATERIAL LAYER AND ELECTRONIC DEVICE HAVING THE SAME

RELATED APPLICATION

This application claims priority from Korean Patent Application No. 10-2014-0135967, filed on Oct. 8, 2014, in the Korean Intellectual Property Office, the disclosure of which is incorporated herein by reference in its entirety.

BACKGROUND

1. Field

Methods and apparatuses consistent with the present disclosure relate to silicene material layers and switching devices having the same.

2. Description of Related Art

Silicene is an allotrope of silicon and contains silicon atoms with a 2-dimensional honeycomb structure. Because silicene has a structure similar to graphene, a band structure of silicene is similar to that of graphene, and electron transportation may be determined using the Dirac equation.

SUMMARY

According to an aspect of an exemplary embodiment, a silicene material layer includes silicon atoms in a 2-dimensional honeycomb structure formed as one of a monolayer and a double layer, the silicene material layer includes a doping region doped with at least one material from the group of Group 1, Group 2, Group 16 and Group 17, and at least one of a p-type dopant and an n-type dopant.

The silicene material layer may be entirely doped with the at least one material from the group of Group 1, Group 2, Group 16 and Group 17, and may include a first region doped with the p-type dopant and a second region doped with the n-type dopant.

The silicene material layer may include a first region and a second region, the first region and the second region doped with an n-type dopant and located on opposite sides of a third region doped with the p-type dopant.

The silicene material layer may include a first region and a second region, the first region and the second region doped with a p-type dopant and located on opposite sides of a third region doped with the n-type dopant.

According to an aspect of another exemplary embodiment, an electronic device includes: a silicene material layer doped with at least one material from the group of Group 1, Group 2, Group 16 and Group 17 and including silicon atoms in a 2-dimensional honeycomb structure formed as a monolayer or a double layer; and a first doping region doped with at least one from the group of a p-type dopant and an n-type dopant; a gate insulating layer and a gate electrode layer formed on the silicene material layer; and a source and a drain respectively formed on opposite sides of the silicene material layer.

The silicene material layer may include a second region and a third region, the second region and the third region doped with an n-type dopant and located on opposite sides of the first region. The first region may be doped with a p-type dopant.

The gate electrode layer may have a width corresponding to a width of the first region.

The silicene material layer may include a second region and a third region the second region and the third region doped with a p-type dopant and located on opposite sides of the first region. The first region may be doped with an n-type dopant.

The gate electrode layer may have a width corresponding to a width of the first region.

The electronic device may further include an intermediate layer between the silicene material layer and the gate insulating layer.

The silicene material layer may include boron nitride (BN).

The electronic device may further include a second intermediate layer, a second gate insulating layer, and a lower gate electrode layer located under the silicene material layer.

The lower gate electrode layer may have a width corresponding to a width of the first doping region.

According to an aspect of yet another exemplary embodiment, an electronic device includes: a silicene material layer doped with at least one material of Group 1, Group 2, Group 16 and Group 17, and at least one of a p-type dopant or an n-type dopant, the silicene material layer including silicon atoms in a 2-dimensional honeycomb structure formed as a monolayer or a double layer structure; and a doping region and; a first electrode and a second electrode respectively formed on opposite sides of the silicene material layer.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
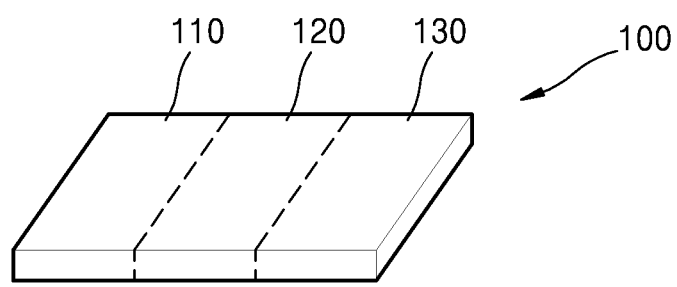
FIG. 1 is a perspective view of a silicene material layer according to an exemplary embodiment.

Reference will now be made in detail to exemplary embodiments, examples of which are illustrated in the accompanying drawings. In the drawings, the widths and thicknesses of layers and regions may be exaggerated for clarity. Also, like reference numerals refer to like elements throughout. Expressions such as "at least one of," when preceding a list of elements, modify the entire list of elements and do not modify the individual elements of the list.

FIG. 1 is a perspective view of a silicene material layer 100 according to an exemplary embodiment.

Referring to FIG. 1, the silicene material layer 100 may contain silicon atoms forming a 2-dimensional honeycomb structure. Also, the silicene material layer 100 may be primarily doped with at least one material from the group of Group 1, Group 2, Group 16 and Group 17. For example, the silicene material layer 100 may be primarily doped with a Group 1 material, such as Li, Na, or K, a Group 2 material, such as Be, Mg, or Ca, and a Group 17 material, such as F, Cl, or Br. If the silicene material layer 100 is doped with a primary doping material, such as Group 1, Group 2, Group 16 or Group 17, the band gap of the silicene material layer 100 may be controlled. As the doping concentration of the doping material in the silicene material layer 100 increases, the band gap of the silicene material layer 100 may be increased.

Also, in a state that the silicene material layer 100 is primarily doped, a secondary doping may be performed by using a p-type dopant or an n-type dopant. For example, the p-type dopant may be boron B and aluminum Al, and the n-type dopant may be phosphate P. However, the secondary doping is not limited thereto. The dopant may be any p-type dopant or n-type dopant that is generally used in semiconductor processes. In FIG. 1, regions 110, 120, and 130 indicate regions in which secondary doping materials are doped. For example, the regions 110 and 130 may be regions doped with a p-type dopant in the silicene material layer 100, and the region 120 may be a region doped with an n-type dopant. Optionally, the regions 110 and 130 may be regions doped with an n-type dopant, and the region 120 may be a region doped with a p-type dopant. In this manner, the silicene material layer 100, according to the current exemplary embodiment, may have an NPN region or a PNP region. However, the doping regions are not limited thereto. That is, the silicene material layer 100 may include at least one of a p-type dopant region and an n-type dopant region.

In this way, the silicene material layer 100 according to an exemplary embodiment may have a 2-dimensional structure in which silicon atoms are formed in a hexagonal honeycomb structure, and may be formed as a mono-layer or a bi-layer. The silicene material layer 100 may include a double-doping region, where both a primary doping material and a secondary doping material are doped. The primary doping material and the secondary doping material respectively may be doped with doping concentrations of approximately $10^{12}$~$10^{21}$/cm$^3$ or $10^8$~$10^{14}$/cm$^2$, and the primary doping material and the secondary doping material, respectively, may substitute silicon atoms of the hexagonal net structure of the silicene material layer 100 or may exist as interstitial type dopants included between silicon atoms. A silicon material layer that is used for electronic devices is formed as a multi-layer structure by a number of bulk state silicon layers. The silicene material layer 100, according to the current exemplary embodiment, has a hexagonal 2-dimensional structure like graphene, and thus, may have a high mobility, and the band gap characteristic may be readily controlled by a doping material.

Figure 2A:
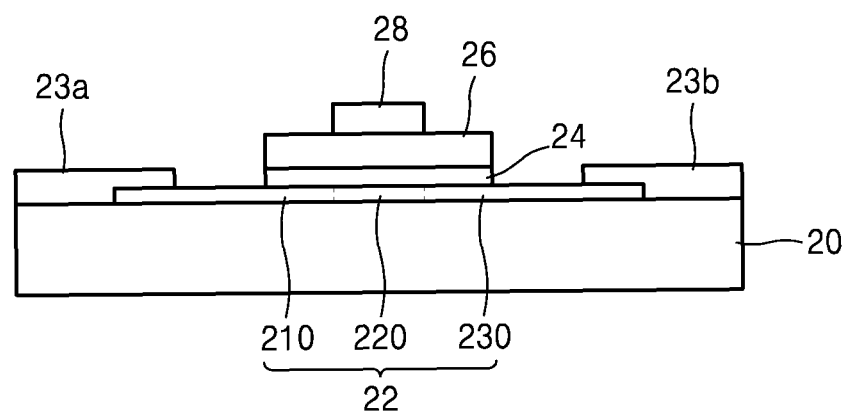
FIG. 2A is a cross-sectional view of an electronic device having a silicene material layer according to an exemplary embodiment.
Figure 2B:
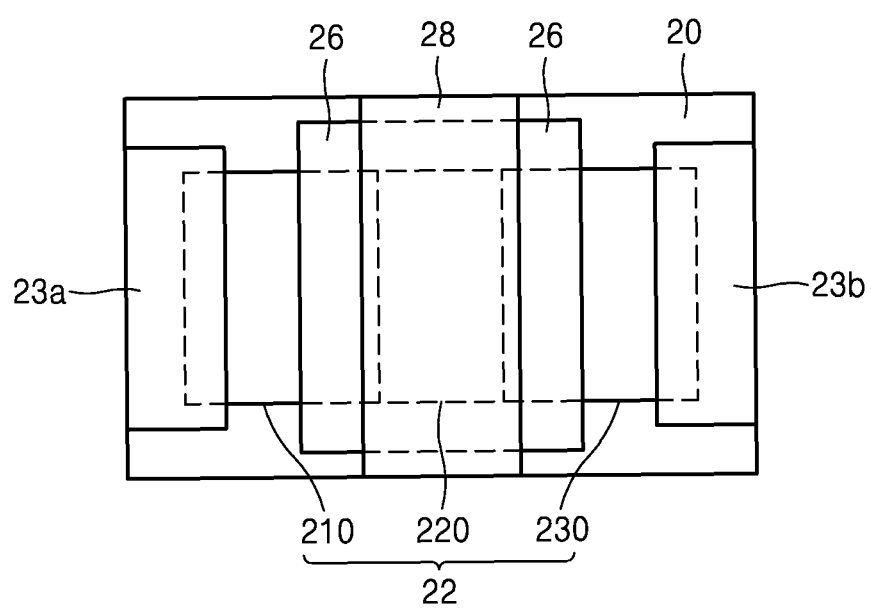
FIG. 2B is a plan view of the electronic device of FIG. 2A.

FIG. 2A is a cross-sectional view of an electronic device having a silicene material layer 22 according to an exemplary embodiment. FIG. 2B is a plan view of the electronic device of FIG. 2A.

Referring to FIGS. 2A and 2B, the electronic device may include the silicene material layer 22 formed on a lower structure 20, an intermediate layer 24 formed on the silicene material layer 22, a gate insulating layer 26, and a gate electrode layer 28. A source 23a and a drain 23b, respectively, may be formed on both sides of the silicene material layer 22. The silicene material layer 22 may be a channel of a transistor device. Also, the silicene material layer 22, as described with reference to FIG. 1, may have a 2-dimensional structure in which silicon atoms form a honeycomb structure, may be primarily doped with at least one material from the group of Group 1, Group 2, Group 16 and Group 17, and may be secondarily doped with a p-type dopant or an n-type dopant. The at least one material from the group of the Group 1, Group 2, Group 16 and Group 17, may be doped on an entire region of the silicene material layer 22, and the p-type dopant or the n-type dopant may be doped on a specific region of the silicene material layer 22. For example, in FIG. 2A, the silicene material layer 22 may be entirely doped with at least one material from the group of the Group 1, Group 2, Group 16 and Group 17. Also, the silicene material layer 22 may include regions 210 and 230 where a p-type dopant is doped, and a region 220 where an n-type dopant is doped. In this manner, the silicene material layer 22 may have a PNP type doping region. Alternatively, the silicene material layer 22 may be formed to have an NPN type doping regions by doping an n-type dopant on the regions 210 and 230 and by doping a p-type dopant on the region 220.

The intermediate layer 24 may optionally be formed to protect the silicene material layer 22 or to prevent the silicene material layer 22 from reacting with other material layers. The intermediate layer 24 may be formed of a material having low reactivity with the silicene material layer 22. For example, the intermediate layer 24 may be formed of hexagonal boron nitride (hBN). The intermediate layer 24 may be formed to be thin, for example, a thickness in a range from a monolayer to a 5-atom layer.

The gate insulating layer 26 may be formed of silicon oxide or a high-k material having a dielectric constant higher than silicon oxide. For example, the gate insulating layer 26 may be formed of silicon oxide, silicon nitride, aluminum oxide, zirconium oxide, hafnium oxide, etc.

The gate electrode layer 28, the source 23a, and the drain 23b may be formed of a conductive material, and may be formed of any material, for example, a metal, a conductive metal oxide, a conductive metal nitride, or a conductive polymer that is used for an electrode material in electronic devices. The gate electrode layer 28, the source 23a, and the drain 23b may be formed of the same conductive material or different materials from each other. The gate electrode layer 28 may be formed on a region above the silicene material layer 22 corresponding to a central region of the silicene material layer 22. For example, when the silicene material layer 22 includes an NPN type doping region, the gate electrode layer 28 may be formed on a region corresponding to the region 220 which is a p-type doping region. When the silicene material layer 22 includes an NPN type doping region, the gate electrode layer 28 may be formed to have a width equal to or slightly greater than that of the p-type doping region, that is, substantially equal to the width of the p-type doping region. When the silicene material layer 22 includes a PNP type doping region, the gate electrode layer 28 may be formed to have a width equal to or slightly greater than that of the n-type doping region, that is, substantially equal to the width of the n-type doping region. The gate electrode layer 28 may control a chemical potential of the silicene material layer 22, and in particular, when the silicene material layer 22 includes a PNP type doping region or an NPN type doping region, the gate electrode layer 28 may control the chemical potential of the region 220 which is a p-type doping region or an n-type doping region.

Figure 3:
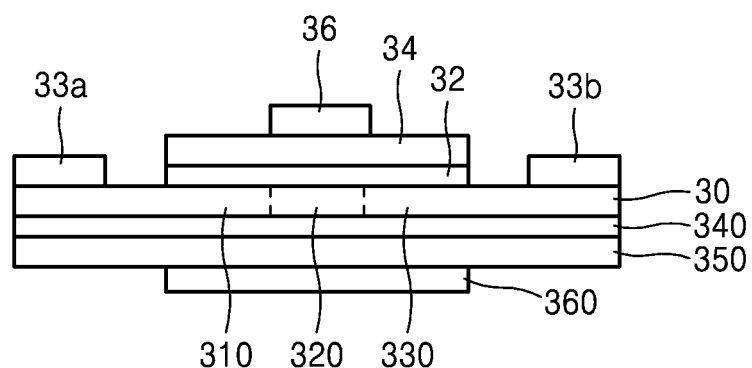
FIG. 3 is a cross-sectional view of an electronic device having a silicene material layer according to another exemplary embodiment.

FIG. 3 is a cross-sectional view of an electronic device having a silicene material layer 30 according to another exemplary embodiment.

Referring to FIG. 3, the electronic device includes the silicene material layer 30, a first intermediate layer 32 formed on the silicene material layer 30, a first gate insulating layer 34, and an upper gate electrode layer 36. A source 33a and a drain 33b, respectively, may be formed on both sides of the silicene material layer 30. A second intermediate layer 340, a second gate insulating layer 350, and a lower gate electrode layer 360 may be formed below the silicene material layer 30.

The silicene material layer 30 may be a channel of a transistor device. Also, the silicene material layer 30 may have a 2-dimensional structure in which silicon atoms form a honeycomb structure, may be primarily doped on an entire region of the silicene material layer 30 with at least one material from the group of Group 1, Group 2, Group 16 and Group 17, and may be secondarily doped on a region thereof with a p-type dopant or an n-type dopant. For example, in FIG. 3, the silicene material layer 30 may be entirely doped with at least one material from the group of the Group 1, Group 2, Group 16 and Group 17. Also, regions 310, 320, and 330 may be selectively doped with one of a p-type dopant and an n-type dopant. For example, the region 320 may be doped with a p-type dopant or an n-type dopant, and the regions 310 and 330 may be doped with a dopant having a different polarity from the dopant of region 320. Accordingly, the silicene material layer 30 may have a PNP type doping region or an NPN type doping region.

The first intermediate layer 32 and the second intermediate layer 340 may be optionally formed to protect the silicene material layer 30 or to prevent the silicene material layer 30 from reacting with other material layers. The first intermediate layer 32 and the second intermediate layer 340 may be formed of, for example, boron nitride (BN). The first intermediate layer 32 and the second intermediate layer 340 may be formed to a thickness in a range from a monolayer to a 5-atom layer.

The first gate insulating layer 34 and the second gate insulating layer 350 may be formed of silicon oxide or a high-k material having a higher dielectric constant than silicon oxide. For example, the first gate insulating layer 34 and the second gate insulating layer 350 may be formed of silicon oxide, silicon nitride, aluminum oxide, zirconium oxide, hafnium oxide, etc.

The upper gate electrode layer 36, the lower gate electrode layer 360, the source 33a, and the drain 33b may be formed of a conductive material, and may be formed of any material, for example, a metal, a conductive metal oxide, a conductive metal nitride, or a conductive polymer that is used for an electrode material in electronic devices. The upper gate electrode layer 36, the lower gate electrode layer 360, the source 33a, and the drain 33b may be formed of the same conductive material or different materials from each other.

The upper gate electrode layer 36 may be formed on a region above the silicene material layer 30 corresponding to a central region of the silicene material layer 30. For example, when the silicene material layer 30 includes an NPN type doping region, the upper gate electrode layer 36 may be formed on a region corresponding to the region 320 which is a p-type doping region. Also, when the silicene material layer 30 includes an NPN type doping region, the upper gate electrode layer 36 may be formed to have a width equal to or slightly greater than that of the p-type doping region, that is, substantially equal to the width of the p-type doping region. When the silicene material layer 30 includes a PNP type doping region, the upper gate electrode layer 36 may be formed to have a width equal to or slightly greater than that of the n-type doping region, that is, substantially equal to the width of the n-type doping region. The lower gate electrode layer 360 may be formed to have a width greater than that of the upper gate electrode layer 36. That is, when the silicene material layer 30 is doped in a PNP type or an NPN type, the upper gate electrode layer 36 may be formed to have a width substantially equal or similar to that of the region 320 which is a central doping region. The lower gate electrode layer 360 may be formed to have a width corresponding to that of both the PNP type doping region and the NPN type doping region of the silicene material layer 30. The whole chemical potential of the silicene material layer 30 may be controlled by forming the lower gate electrode layer 360 below the silicene material layer 30.

Figure 4:
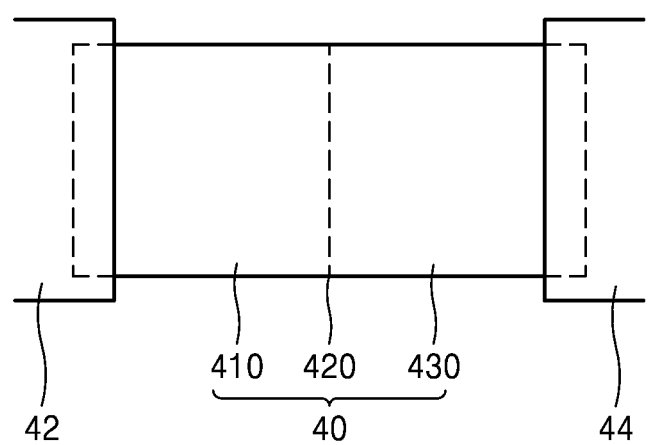
FIG. 4 is a cross-sectional view of an electronic device having a silicene material layer according to another exemplary embodiment.

FIG. 4 is a cross-sectional view of an electronic device having a silicene material layer 40 according to another exemplary embodiment.

Referring to FIG. 4, the electronic device may include the silicene material layer 40, and a first electrode 42 and a second electrode 44 that are formed on both sides of the silicene material layer 40. The silicene material layer 40 may be primarily doped with at least one material from the group of Group 1, Group 2, Group 16 and Group 17. A p-type dopant or an n-type dopant may be secondarily doped on a region of the silicene material layer 40. For example, a region 410 of the silicene material layer 40 is a region on which one of a p-type dopant or an n-type dopant is doped, and a region 430 may be a region doped with a dopant having a different polarity from the dopant of the region 410. For example, when the region 410 is a p-type dopant region, the region 430 may an n-type dopant region, and when the region 410 an n-type dopant region, the region 430 may be a p-type dopant region. The first electrode 42 and the second electrode 44 may be formed of a conductive material, for example, a metal, a conductive metal oxide, a conductive metal nitride, or a conductive polymer. In the electronic device depicted in FIG. 4, the silicene material layer 40 includes a first doping region 410, a second doping region 430, and an intermediate region 420 between the first and second doping regions 410 and 430. The electronic device having the above structure may be a diode type electronic device.

FIGS. 5A through 5F are cross-sectional views illustrating a method of manufacturing an electronic device having a silicene material layer 52 according to an exemplary embodiment.

Figure 5A:
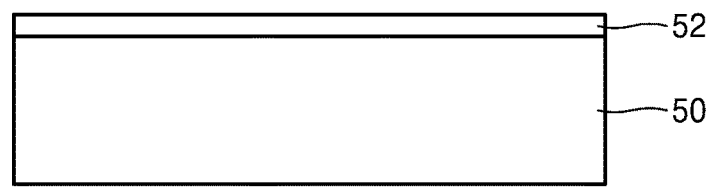
FIGS. 5A through 5F are cross-sectional views illustrating a method of manufacturing an electronic device having a silicene material layer according to an exemplary embodiment.

Referring to FIG. 5A, the silicene material layer 52 is formed on a lower structure 50. The lower structure 50 may be a material layer that is used as a substrate of a general electronic device, and may be a material layer formed of the material used to form the intermediate layer 24 of FIG. 2. The silicene material layer 52 is formed of silicon atoms in a 2-dimensional honeycomb structure, and may have a monolayer structure or a bi-layer structure. The silicene material layer 52 may be formed on the lower structure 50 by heating silicon at a temperature in a range from about 200° C. to about 300° C. in a chamber or may be formed such that, after forming silicene on a material, such as Ag, the silicene may be transferred onto the lower structure 50.

Figure 5B:
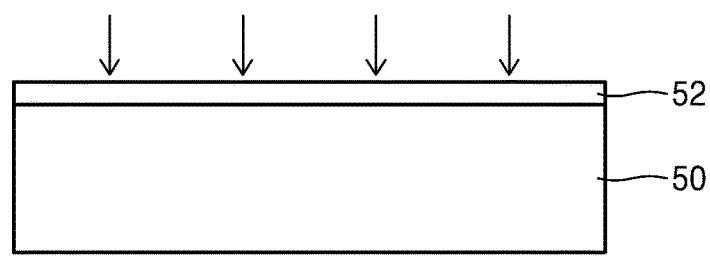

Referring to FIG. 5B, the silicene material layer 52 is primarily doped with at least one material from the group of Group 1, Group 2, Group 16 and Group 17. The primary doping process may be performed on an entire region of the silicene material layer 52.

Figure 5C:
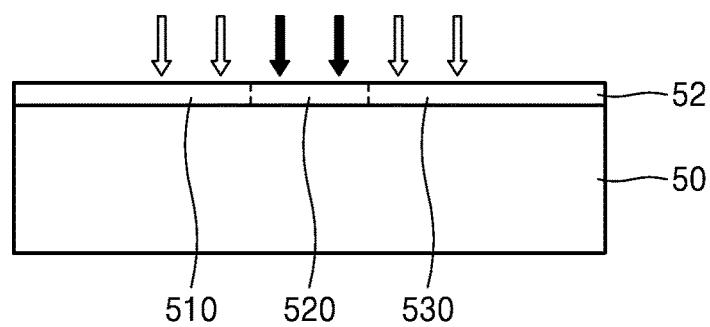

Referring to FIG. 5C, a secondary doping process is performed to dope a p-type dopant or an n-type dopant on a specific region of the silicene material layer 52 on which the primary doping is performed. For example, regions 510 and 530 of the silicene material layer 52 may be doped with one of a p-type dopant and an n-type dopant. A region 520 of the silicene material layer 52 may be doped with a dopant having a different polarity from the dopant of the regions 510 and 530. For reference, the doping processes with respect to the silicene material layer 52, described as the secondary doping process, is performed after performing the primary doping process. However, the current embodiment is not limited thereto, that is, the sequence may be reversed. For example, after doping a p-type dopant or an n-type dopant on a specific region of the silicene material layer 52, at least one material from the group of Group 1, Group 2, Group 16 and Group 17 may be doped on the entire region of the silicene material layer 52.

Figure 5D:
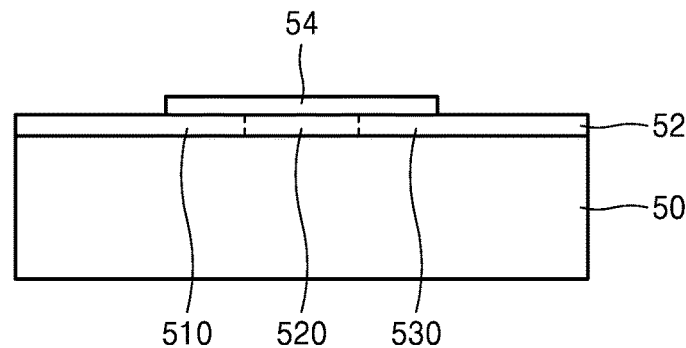

Referring to FIG. 5D, an intermediate layer 54 may be formed on the silicene material layer 52. The intermediate layer 54 may be optionally formed to protect the silicene material layer 52 or to prevent the silicene material layer 52 from reacting with other material layers. The intermediate layer 54 may be formed of a material having low reactivity with the silicene material layer 52, for example, boron nitride (BN). The intermediate layer 54 may be formed to be thin, for example, to a thickness in a range from a monolayer to a 5-atom layer.

Figure 5E:
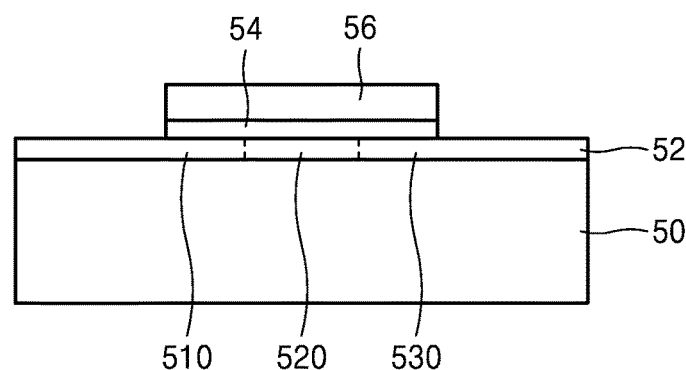

Referring to FIG. 5E, a gate insulating layer 56 may be formed on the intermediate layer 54. The gate insulating layer 56 may be formed of silicon oxide or a high-k material having a dielectric constant higher than silicon oxide.

Figure 5F:
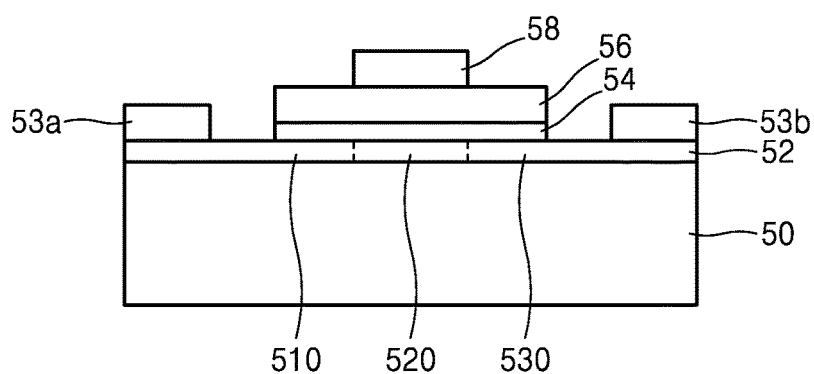

Referring to FIG. 5F, a gate electrode layer 58 med on the gate insulating layer 56, and a source 53a and the drain 53b are respectively formed on both side of the silicene material layer 52. The gate electrode layer 58, the source 53a, and the drain 53b may be formed of a conductive material, for example, a metal, a conductive metal oxide, a conductive metal nitride, or a conductive polymer.

According to the current exemplary embodiment, a silicene material layer that can freely control a band gap is provided. Also, an electronic device, for example, a switching device, such as a thin film transistor, that includes the silicene material layer is provided. Also, a silicon layer of multi-layer structure may be used in a semiconductor device that includes silicon A silicene transistor according to the current exemplary embodiment requires a monolayer silicon layer, and thus, the degree of integration of the electronic device is increased.

While exemplary embodiments have been particularly shown and described with reference to the drawings, it will be understood by those of ordinary skill in the art that various changes in form and details may be made therein without departing from the spirit and scope of the inventive concept, as defined by the appended claims. The exemplary embodiments should be considered in descriptive sense only and not for purposes of limitation. Therefore, the scope of the present disclosure is defined not by the detailed description, but by the appended claims, and all differences within the scope will be construed as being included in the present disclosure.

What is claimed is:

1. A silicene material layer comprising silicon atoms in a 2-dimensional honeycomb structure formed as one of a monolayer and a double layer, the silicene material layer comprising:
 a doping region doped with at least one material from the group of Group 1, Group 2, Group 16 and Group 17 and at least one of a p-type dopant and an n-type dopant.

2. The silicene material layer of claim 1, wherein the silicene material layer is entirely doped with the at least one material from the group of Group 1, Group 2, Group 16 and Group 17 and comprises a first doping region doped with the p-type dopant and a second doping region doped with the n-type dopant.

3. The silicene material layer of claim 1, wherein the silicene material layer comprises a first doping region and a doping second region, the first doping region and the second doping region doped with an n-type dopant, and located on opposite sides of a third region doped with the p-type dopant.

4. The silicene material layer of claim 1, wherein the silicene material layer comprises a first doping region and a third doping region, the first doping region and the second doping region doped with a p-type dopant and located on opposite sides of a third doping region doped with the n-type dopant.

5. An electronic device comprising:
 a silicene material layer doped with at least one material from the group of Group 1, Group 2, Group 16 and Group 17, the silicene material layer comprising:
  silicon atoms in a 2-dimensional honeycomb structure formed as a monolayer or a double layer; and
  a first doping region doped with at least one from the group of a p-type dopant and an n-type dopant;
 a gate insulating layer and a gate electrode layer formed on the silicene material layer; and
 a source and a drain respectively formed on opposite sides of the silicene material layer.

6. The electronic device of claim 5, wherein the silicene material layer comprises a second doping region and a third doping region, the second doping region and the third doping region doped with an n-type dopant and located on opposite sides of the first region, and
 wherein the first doping region is doped with a p-type dopant.

7. The electronic device of claim 6, wherein the gate electrode layer has a width corresponding to a width of the first doping region.

8. The electronic device of claim 5, wherein the silicene material layer comprises a second doping region and a third doping region the second doping region and the third doping region doped with a p-type dopant and located on opposite sides of the first region, and
 wherein the first doping region is doped with an n-type dopant.

9. The electronic device of claim 8, wherein the gate electrode layer has a width corresponding to a width of the first doping region.

10. The electronic device of claim 5, further comprising an intermediate layer between the silicene material layer and the gate insulating layer.

11. The electronic device of claim 5, wherein the silicene material layer comprises boron nitride (BN).

12. The electronic device of claim 5, further comprising:
 a second intermediate layer;
 a second gate insulating layer; and
 a lower gate electrode layer,
 wherein the second intermediate layer, the second gate insulating layer and the lower gate electrode layer are located under the silicene material layer.

13. The electronic device of claim 12, wherein the lower gate electrode layer has a width corresponding to a width of the first doping region.

14. An electronic device comprising:
 a silicene material layer doped with at least one material of Group 1, Group 2, Group 16 and Group 17, and at least one of a p-type dopant or an n-type dopant, the silicene material layer comprising:
  silicon atoms in a 2-dimensional honeycomb structure formed as a monolayer or a double layer structure; and a first doping region; and a first electrode and a second electrode respectively formed on opposite sides of the silicene material layer.

15. The electronic device of claim 14, wherein the silicene material layer comprises a second doping region and a third doping region, the second doping region and the third doping region doped with an n-type dopant and located on opposite sides of the first region, and wherein the first doping region is doped with a p-type dopant.

16. The electronic device of claim 15, wherein the gate electrode has a width corresponding to a width of the first doping region.

17. The electronic device of claim 14, wherein the silicene material layer comprises a second doping region and a third doping region, the second doping region and the third doping region doped with a p-type dopant and located on opposite sides of the first region, and wherein the first doping region is doped with an n-type dopant.

18. The electronic device of claim 17, wherein the gate electrode has a width corresponding to a width of the first doping region.

19. The electronic device of claim 14, further comprising an intermediate layer between the silicene material layer and the gate insulating layer.

20. The electronic device of claim 14, wherein the silicene material layer comprises boron nitride (BN).

\* \* \* \* \*